(12) United States Patent
Murata et al.

(10) Patent No.: US 9,531,051 B2
(45) Date of Patent: Dec. 27, 2016

(54) BOARD CONNECTION STRUCTURE

(71) Applicant: Panasonic Corporation, Osaka (JP)

(72) Inventors: Tomohiro Murata, Osaka (JP); Takeshi Fukuda, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/679,844

(22) Filed: Apr. 6, 2015

(65) Prior Publication Data

US 2015/0303541 A1    Oct. 22, 2015

(30) Foreign Application Priority Data

Apr. 17, 2014  (JP) .................................. 2014-085812

(51) Int. Cl.
*H01P 5/02* (2006.01)
*H05K 1/11* (2006.01)
*H01P 1/04* (2006.01)
*H05K 1/14* (2006.01)

(52) U.S. Cl.
CPC .............. *H01P 5/024* (2013.01); *H01P 1/042* (2013.01); *H05K 1/116* (2013.01); *H05K 1/144* (2013.01)

(58) Field of Classification Search
CPC ............. H01P 1/08; H01P 1/042; H01P 5/024; H01P 5/181; H01P 5/02; H05K 1/11; H05K 1/116; H05K 1/144
USPC .................................................. 333/252, 254
See application file for complete search history.

(56) References Cited

U.S. PATENT DOCUMENTS 6,515,562 B1 *  2/2003  Takenoshita .............. H01P 5/02
                                                        333/248

FOREIGN PATENT DOCUMENTS

JP     2008-131513     6/2008
JP     2009-303076    12/2009

* cited by examiner

*Primary Examiner* — Benny Lee
*Assistant Examiner* — Albens Dieujuste
(74) *Attorney, Agent, or Firm* — Greenblum & Bernstein, P.L.C.

(57) ABSTRACT

A board connection structure includes an opening, which is formed at a perimeter of a waveguide in a first board, and an opening, which is formed at a perimeter of a waveguide in a second board. The openings are connected to each other. The first board and the second board are connected with an insulation film disposed therebetween. The insulation film has a thickness of 60% or less of a waveguide width that determines a propagation mode in at least one of the waveguide in the first board and the waveguide in the second board.

5 Claims, 5 Drawing Sheets

BOARD CONNECTION STRUCTURE

BACKGROUND

1. Technical Field

The present disclosure relates to a board connection structure for wireless communication devices or high-frequency applied devices used in household electrical appliances.

2. Description of the Related Art

Recent higher-speed and higher-frequency wireless communication has created a demand for devices, which are essential for wireless communication, to be usable in high-frequency bands. In signal transmission in wireless communication devices or high-frequency applied devices, a coaxial cable is used for a frequency band lower than the microwave band, for example. However, at frequency bands higher than the microwave band, transmission loss is large in at least one of the dielectric and the conductor. To prevent the transmission loss, waveguides that allow low-loss transmission are widely used for the high-frequency band higher than the millimeter wave band.

A high-frequency signal can be transmitted with low loss in a circuit board for a high-frequency wave band by using a quasi-waveguide as a transmission line. The quasi-waveguide is obtained by using a layer-structure of the circuit board. Methods for taking out a signal from the circuit board to connect the circuit board to another circuit board are described in patent documents, for example. Japanese Unexamined Patent Application Publication No. 2008-131513 describes that a metal connector for waveguides is attached to a circuit board. Japanese Unexamined Patent Application Publication No. 2009-303076 describes that the openings of the waveguides are connected to each other and the circuit boards are bonded and fixed to each other.

FIG. 7 is a cross-sectional view illustrating a board connection structure described in Japanese Unexamined Patent Application Publication No. 2009-303076. In FIG. 7, a first dielectric substrate 100 and a second dielectric substrate 200 are connected and fixed through a plurality of metal bumps 300. The first dielectric substrate 100 includes a quasi-waveguide 110 that is formed of grounding conductor via holes 400, which are connected to a grounding conductor, and the dielectric. The second dielectric substrate 200 includes a quasi-waveguide 210 that is formed of grounding conductor via holes 500, which are connected to a grounding conductor, and the dielectric. The quasi-waveguide 110 and the quasi-waveguide 210 are connected by bonding the first dielectric substrate 100 and the second dielectric substrate 200 to each other.

SUMMARY

The circuit boards bonded to each other, which is a conventional technique described in Japanese Unexamined Patent Application Publication No. 2009-303076, cannot be easily separated. The circuit boards each including the metal connector, which are described in Japanese Unexamined Patent Application Publication No. 2008-131513, are likely to include a plurality of connection holes in a surface thereof. Thus, the connectors make up a large proportion of module size or weight, and the module size increases.

One non-limiting and exemplary embodiment provides a board connection structure for transmitting a high-frequency signal over a plurality of circuit boards through the waveguides in the circuit boards, in which the module size is unlikely to increase and the circuit boards are connected in a detachable manner.

In one general aspect, the techniques disclosed here feature a board connection structure that includes a first board including a first waveguide therein and a first opening in a surface thereof, a second board including a second waveguide therein and a second opening in a surface thereof, and an insulation film provided between the first board and the second board. The first opening is formed at a perimeter of the first waveguide and allows a high-frequency signal to pass therethrough. The second opening is formed at a perimeter of the second waveguide and allows a high-frequency signal to pass therethrough. The insulation film has a thickness of 60% or less of a waveguide width that determines a propagation mode in at least one of the first waveguide and the second waveguide. The first opening and the second opening are connected to each other.

This disclosure provides a board connection structure for transmitting a high-frequency signal over a plurality of circuit boards through waveguides in the circuit boards, in which closeness between the boards is maintained and the boards are connected in a detachable manner.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
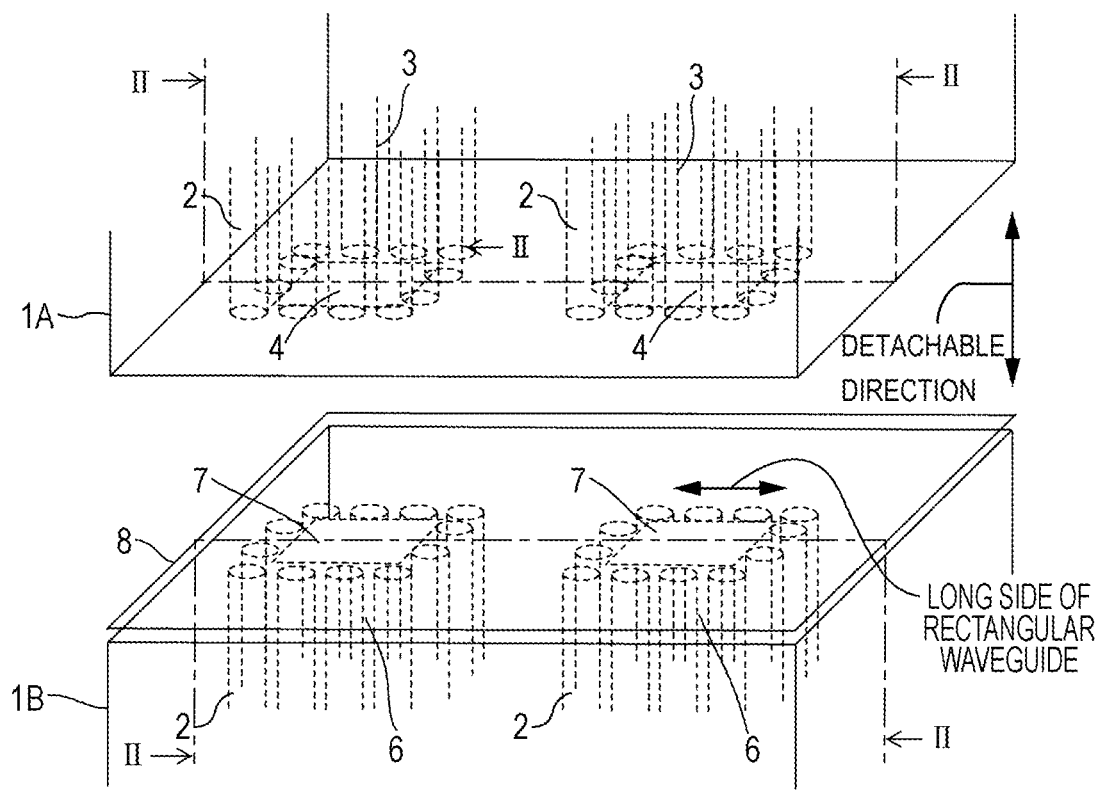
FIG. 1 is a perspective view schematically illustrating a board connection structure according to a first embodiment.

Hereinafter, embodiments of the present disclosure will be described with reference to the drawings.

Underlying Knowledge Forming Basis of the Present Disclosure

A metal connector is widely used to enable detachable connection between waveguides in circuit boards. Japanese Unexamined Patent Application Publication No. 2004-048423, for example, discloses a low-loss connection structure. Japanese Unexamined Patent Application Publication No. 2012-060430 discloses a connection structure between waveguide plates including hollow waveguides, in which an increase in transmission loss is reduced even when connected portions of the waveguide plates are misaligned. Japanese Unexamined Utility Model Registration Application Publication No. 2-092201 discloses a structure including a dielectric substrate having a conductive film on each surface thereof to transmit the signal in the waveguide to a microstrip line on the dielectric substrate. The dielectric substrate includes a through hole that electrically connects the conductors disposed on its surfaces. The dielectric substrate is sandwiched between the waveguides.

The boards bonded to each other in the conventional technique, which is described in Japanese Unexamined Patent Application Publication No. 2009-303076, for example, cannot be easily separated. A connection between a high-frequency board, on which a high-frequency circuit chip for a millimeter-wave band is mounted, and each of a few types of antenna boards will be described as an example. In the conventional technique, since the antenna board and the high-frequency circuit board cannot be easily separated, the high-frequency circuit chip should be provided for each of the antenna boards or each of antenna structures, though the circuit chip for signal processing is shared by the antenna boards and the antenna structures. As a result, the cost increases.

Japanese Unexamined Patent Application Publication No. 2012-060430 discloses a connection structure formed of hollow waveguides that has a tolerance against clearance (gap) formation between the circuit boards or misalignment of the circuit boards. However, although not described in Japanese Unexamined Patent Application Publication No. 2012-060430, it is difficult to make the inside of the waveguides in the circuit board be hollow, which is the configuration described in the present disclosure (detail will be described later). In addition, since a cutoff frequency is determined by a free space wavelength in the hollow waveguide, the available frequency range may be more limited.

Furthermore, a typical dielectric substrate disposed between the waveguides, which is described in Japanese Unexamined Utility Model Registration Application Publication No. 2-092201, is thick and hard. Thus, the waveguides cannot be closely attached to the dielectric substrate.

The following describes a board connection structure for transmitting a high-frequency signal over a plurality of circuit boards through waveguides in the circuit boards for a high-frequency band, in which closeness between the boards is maintained and the boards are connected in a detachable manner.

First Embodiment

FIG. 1 is a perspective view schematically illustrating a board connection structure according to a first embodiment. In FIG. 1, the board connection structure according to this embodiment includes an antenna board (first board) 1A having an antenna (not illustrated), for example, on its upper surface, an IC board (second board) 1B having a semiconductor chip for signal processing (not illustrated), for example, on its lower surface, and an insulation film 8. The antenna board 1A includes via holes 2 therein, waveguides (first waveguide) 3 formed of the via holes 2, and openings (first opening) 4 in its lower surface. The openings 4 are formed at the perimeters of the waveguides 3 and connected to the waveguides 3. A high-frequency signal is transmitted from or to the antenna board 1A through the opening 4. The IC board 1B includes via holes 2 therein, waveguides (second waveguides) 6 formed of by the via holes 2, and openings (second openings) 7 in its upper surface. The openings 7 are formed at the perimeters of the waveguides 6 and connected to the waveguides 6. A high-frequency signal is transmitted from or to the IC board 1B through the openings 7. The insulation film 8 is disposed on the upper surface of the IC board 1B. The insulation film 8 has a thickness of 60% or less of the waveguide width that determines the propagation mode (dimension between inner sides of the via holes 2 or the length of the long side of the rectangular waveguides) in the waveguides 3 of the antenna board 1 and the waveguides 6 of the IC board 1B.

In the board connection structure according to this embodiment, the openings 4 and 7 are provided for the waveguides 3 and 6, respectively. The antenna board 1A and the IC board 1B are connected such that the openings 4 overlap the openings 7. The openings 4 and the openings 7 do not need to completely overlap and may partly overlap. In this disclosure, the openings 4 and the openings 7 may be connected with the insulation film 8 disposed therebetween.

The antenna is mounted on the surface (upper surface) of the antenna board 1A, which is a surface opposite to the surface of the antenna board 1A having the openings 4. The semiconductor chip for signal processing is mounted on the surface (lower surface) of the IC board 1B, which is a surface opposite to the surface of the IC board 1B having the openings 7.

Figure 2:
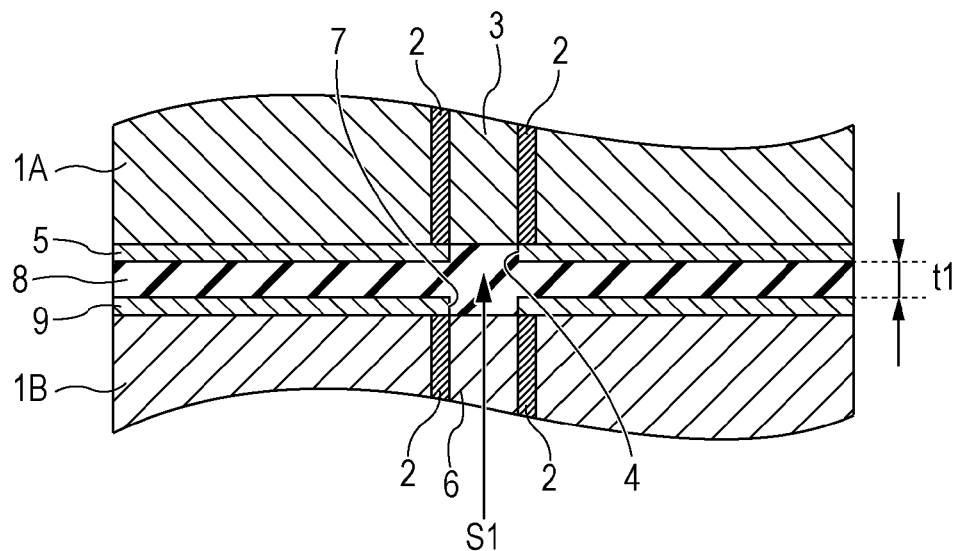
FIG. 2 is a cross-sectional view, taken along the cross-sectional line II-II, illustrating a portion including a waveguide of the board connection structure in FIG. 1.

FIG. 2 is a magnified cross-sectional view illustrating the waveguides 3 and 6 and the openings 4 and 7 of the board connection structure in FIG. 1. Although not illustrated in FIG. 1, a ground 5 that is electrically grounded is disposed on the entire lower surface of the antenna board 1A except for the areas including the openings 4, and a ground 9 that is electrically grounded is disposed on the entire upper surface of the IC board 1B except for the areas including the openings 7. The via holes 2 are electrically connected to the ground 5 in the antenna board 1A and electrically connected to the ground 9 in the IC board 1B.

As illustrated in FIG. 2, the insulation film 8 having a thickness t1, which is 60% or less of the waveguide width of the waveguides 3 and 6, absorbs unevenness of the surfaces of the antenna board 1A and the IC board 1B. Thus, the surfaces of the antenna board 1A and the IC board 1B are flattened, which increases closeness between the antenna board 1A and the IC board 1B. In addition, the insulation film 8 prevents contact between the metals around the openings 4 and 7, i.e., the grounds 5 and 9. Thus, the openings 4 and 7 are unlikely to be damaged while the antenna board 1A and the IC board 1B are attached to or detached from each other.

Figure 3:
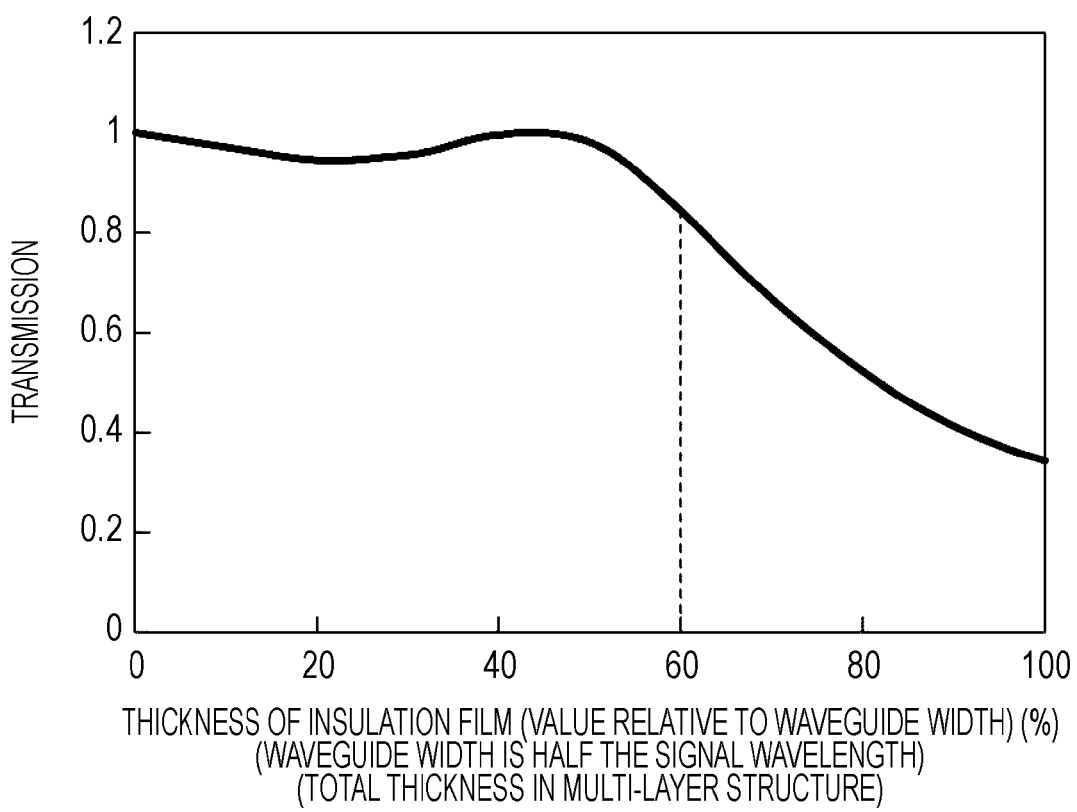
FIG. 3 shows a result of an electromagnetic field simulation, which shows changes in transmission with respect to changes in thickness of the insulation film in the board connection structure according to the first embodiment.

The high-frequency signal S1 sent out through the openings 7 of the IC board 1B passes through the insulation film 8 and enters the openings 4 of the antenna board 1A. FIG. 3 shows the result of an electromagnetic field simulation, which shows changes in transmission (transmissivity) with respect to the thickness t1 of the insulation film 8. In FIG. 3, the transmission is calculated by using a frequency whose corresponding electromagnetic wavelength is twice the waveguide width (the width of each of the waveguides 3, 6). FIG. 3 shows that the transmission of the electromagnetic wave decreases when the thickness of the insulation film 8 exceeds 60% of the waveguide width, which determines the cutoff frequency (waveguide width is half the signal wavelength). Setting of the thickness of the insulation film 8 at 60% or less of the waveguide width reduces decrease in transmission.

The insulation film 8 is formed of a material that can change its shape under pressure. When pressure is applied to the connection between the antenna board 1A and the IC board 1B with the insulation film 8 disposed therebetween, the insulation film 8 changes its shape to accommodate warpage of the boards or uneven surfaces of the boards. This increases the closeness of the boards, and a signal is transmitted with low loss.

The insulation film 8 may be formed of any one of fluorocarbon polymer, silicon oxide (SiOx), silicon nitride (SiN), silicon oxynitride (SiON), benzocyclobutene (BCB), polybenzobisoxazole (PBO), and a combination thereof.

Examples of the fluorocarbon polymer include perfluoro alkoxy alkane (PFA), ethylene tetrafluoroethylene copolymer (ETFE), polytetrafluoroethylene (PTFE), perfluoroethylene-propene copolymer (FEP), polyvinylidene fluoride (PVDF), and ethylene chlorotrifluoroethylene copolymer (ECTFE). However, the fluorocarbon polymer is not limited to the examples.

In the board connection structure according to this embodiment, the openings 4 of the antenna board 1A and the openings 7 of the IC board 1B are at least partially connected to each other. The IC board 1B includes the insulation film 8 on its surface including the openings 7. The insulation film 8 has a thickness of 60% or less of the waveguide width of the waveguides 3 in the antenna board 1A and the waveguides 6 in the IC board 1B. With this configuration, strong connection between the opening 4 of the antenna board 1A and the opening 7 of the IC board 1B is maintained, and the antenna board 1A and the IC board 1B are readily detachable (The vertical double-sided arrow shown in FIG. 1 represents a detachable direction of the antenna board 1A and the IC board 1B).

In addition, the openings 4, 7 are not in contact with each other when the antenna board 1A and the IC board 1B are connected. This reduces wear or deformation of the openings 4, 7 which may be caused while the antenna board 1A and the IC board 1B are attached to or detached from each other. Thus, increase in transmission loss is reduced.

In addition, since the strong connection between the openings 4, 7 is maintained, a clearance (gap) will not be formed at the connection as a result of warp or deflection of the circuit boards. Furthermore, the leakage of the high-frequency signal S1 into the insulation film 8 is reduced. Thus, the signal is transmitted with high efficiency and low loss.

In the board connection structure according to this embodiment, the insulation film 8 is disposed on the IC board 1B. However, the insulation film 8 may be disposed on the antenna board 1A or may be disposed on both of the antenna board 1A and the IC board 1B. In other words, the insulation film 8 may be disposed on at least one of the antenna board 1A and the IC board 1B.

In the board connection structure according to this embodiment, each of the antenna board 1A and the IC board 1B includes two waveguides. However, the number of waveguides is not limited to two. In addition, the number of openings in each of the antenna board 1A and the IC board 1B is not limited to two.

In the board connection structure according to this embodiment, as illustrated in FIG. 2, the waveguides 3 in the antenna board 1A extend from the rear surface to the front surface of the antenna board 1A. However, the shape of the waveguides and the shape of the openings are not limited to the shapes illustrated in FIG. 2. As long as the antenna board 1A includes the openings in its surface, the openings and the waveguides connected thereto may have any shape. The same is applicable to the IC board 1B.

One of layers of the antenna board 1A and one of layers of the IC board 1B, which are used in the connection structure, have been described in the board connection structure according to this embodiment. However, the antenna board 1A and the IC board 1B may have a multi-layer structure (two or more layers). The waveguides 3 or the waveguides 6 may extend through two or more layers in the multi-layer antenna board 1A or the multi-layer IC board 1B.

In the board connection structure according to this embodiment, as illustrated in FIG. 2, the waveguide has a rectangular cross-sectional shape. However, the shape of the waveguide in this embodiment is not limited to the rectangular cross-sectional shape, and may be circular or any shape.

Second Embodiment

Figure 4:
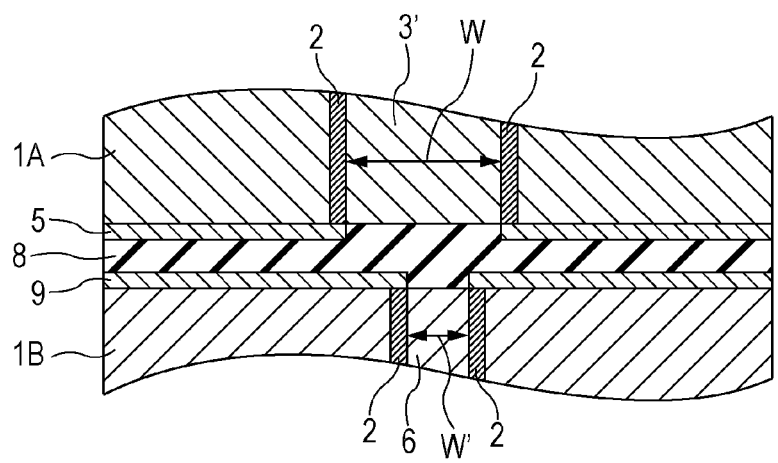
FIG. 4 is a cross-sectional view illustrating a portion including the waveguide of the board connection structure according to a second embodiment.

FIG. 4 is a cross-sectional view illustrating a portion including waveguides in a board connection structure according to a second embodiment. In FIG. 4, the same components as those in FIG. 1 and FIG. 2 are assigned the same symbols as those in FIG. 1 and FIG. 2. In the board connection structure according to this embodiment, a waveguide 3' of the antenna board 1A has a waveguide width W that is larger than a waveguide width W' of the waveguide 6 of the IC board 1B. In addition, the antenna board 1A has a relative permittivity $\in_r$ that is lower than a relative permittivity $\in_r'$ of the IC board 1B.

Figure 5:
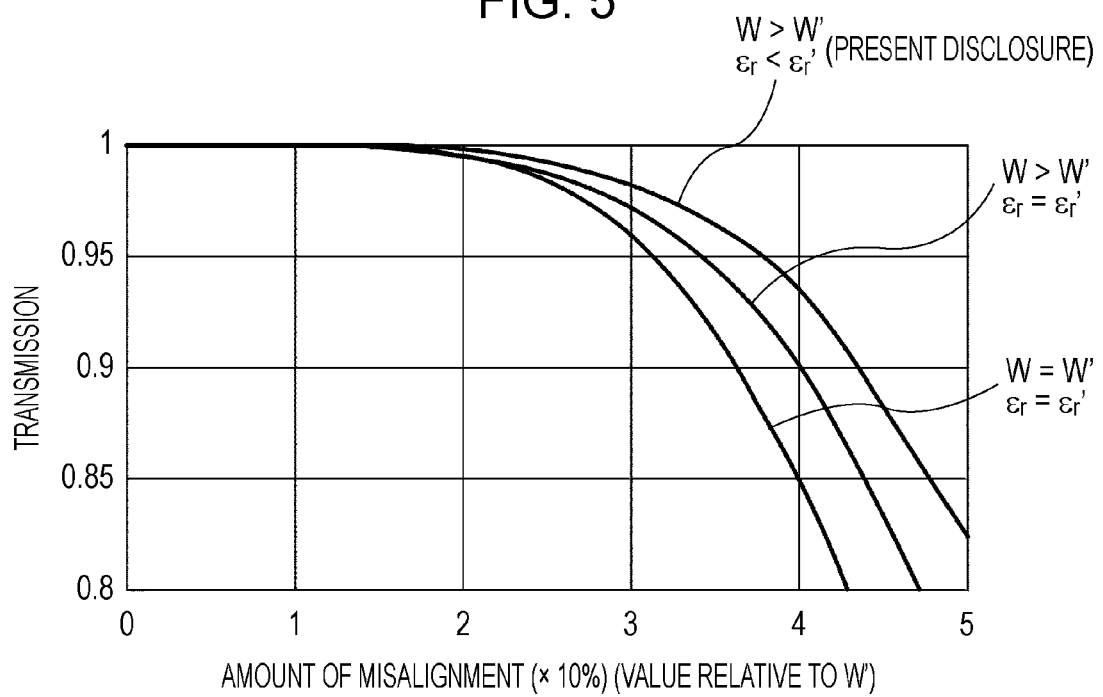
FIG. 5 shows a result of an electromagnetic field simulation, which shows changes in transmissions with respect to amounts of misalignment in the board connection structure according to the second embodiment in which boards have different waveguide widths and different relative dielectrics.

FIG. 5 shows the result of an electromagnetic field simulation, which shows changes in transmission with respect to amounts of misalignment (value relative to the waveguide width W'). In FIG. 5, W>W' denotes that the waveguide width W is larger than the waveguide width W' by 20% and $\in_r<\in_r'$ denotes that $\in_r$ is 3.5 and $\in_r'$ is 4.5. This result shows that, even though the amount of misalignment is large, the decrease in transmission is relatively small in the board connection structure according to this embodiment (W>W', $\in_r<\in_r'$) compared with the connection structure in which the waveguide widths are equal and values of the relative permittivity are equal (W=W', $\in_r=\in_r'$).

As illustrated in FIG. 5, the decrease in transmission is reduced when the conditions of the board connection structure according to this embodiment are satisfied by setting the waveguide width W of the waveguide 3' of the antenna board 1A and the waveguide width W' of the waveguide 6 of the IC board 1B to different values and further setting the relative permittivity $\in_r$ of the antenna board 1A and the relative permittivity $\in_r'$ of the IC board 1B to different values. This reduction in decrease in transmission may be achieved due to the fact that the mode of the standing wave can be maintained in the waveguide even when the waveguide width is made smaller, because the wavelength is shortened due to the difference in permittivity. Therefore, in the board connection structure according to this embodiment, an increase in transmission loss is reduced even when the boards are misaligned while being attached to or detached from each other.

As described above, in the board connection structure according to this embodiment, the waveguide width W of the waveguide 3' of the antenna board 1A is larger than the waveguide width W' of the waveguide 6 of the IC board 1B, and the relative permittivity $\in_r$ of the antenna board 1A is lower than the relative permittivity $\in_r'$ of the IC board 1B. Therefore, even when the antenna board 1A and the IC board 1B are misaligned while being connected to each other, an increase in transmission loss is reduced. In addition, the relationship between the wavelength in the dielectric and the waveguide width of the waveguide in one board and the relationship between the wavelength in the dielectric and the waveguide width of the waveguide in another board can be adjusted so as to be similar to each other. Thus, the occurrence of undesirable modes is reduced, and an increase in transmission loss is reduced.

The board connection structure according to this embodiment can have the above-described advantages regardless of whether the insulation film 8 is present or not. Thus, the insulation film 8 may be eliminated to obtain the advantages achieved by the board connection structure according to this embodiment.

As illustrated in the cross-sectional view of FIG. 4, in the board connection structure according to this embodiment, the waveguide 3' of the antenna board 1A extends between the lower surface and the upper surface of the antenna board 1A. However, the shape of the waveguide 3' is not limited to that illustrated in FIG. 4. As long as the antenna board 1A includes the opening in its surface, the waveguide 3' connected thereto and the opening thereof may have any shape. The same is applicable to the IC board 1B.

FIG. 4 is a cross-sectional view illustrating the waveguide 3' in such a manner that the long side of the waveguide 3' may be seen. The long side corresponds to the waveguide width that determines the propagation mode in the rectangular waveguide. The long side of the waveguide 3' is longer than the long side of the waveguide 6. The short side of the rectangular waveguide 3' (dimension in a direction away from the viewer in FIG. 4), which has no bearing on the propagation mode, may be longer than the short side of the waveguide 6 in accordance with the possible degree of misalignment. This facilitates alignment adjustment. The size relationship between the long side and the short side of each rectangular waveguide should be maintained.

As illustrated in the cross-sectional view of FIG. 4, in the board connection structure according to this embodiment, the waveguide has a rectangular cross-sectional shape. However, the waveguide of this embodiment is not limited to the rectangular cross-sectional shape. The waveguide may have a circular shape or any cross-sectional shape.

Third Embodiment

Figure 6A:
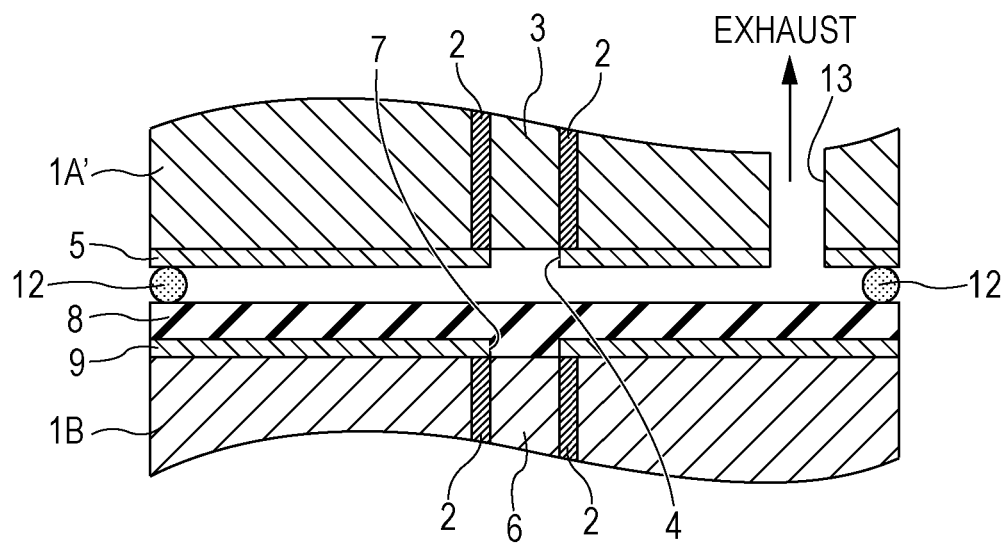
FIGS. 6A and 6B are cross-sectional views each illustrating a portion including the waveguide of a board connection structure according to a third embodiment.
Figure 6B:
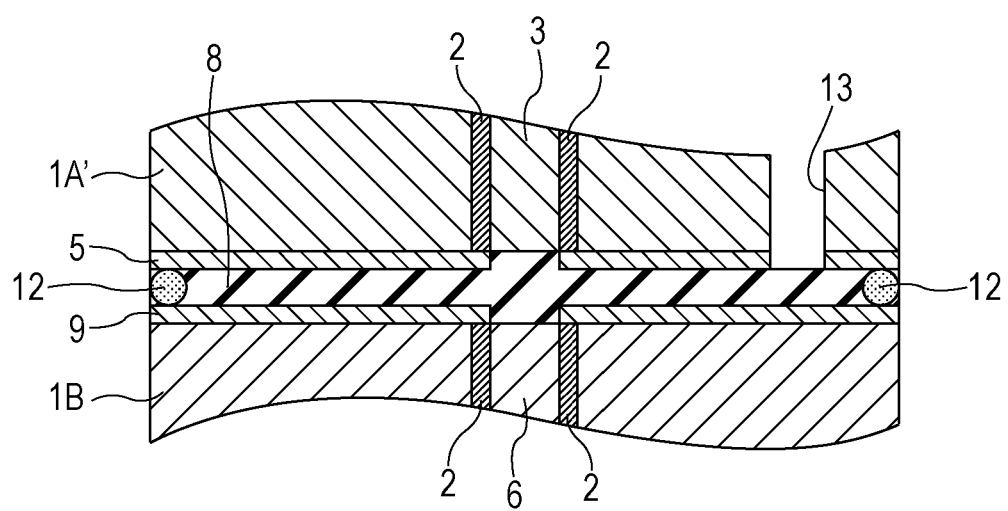
Figure 7:
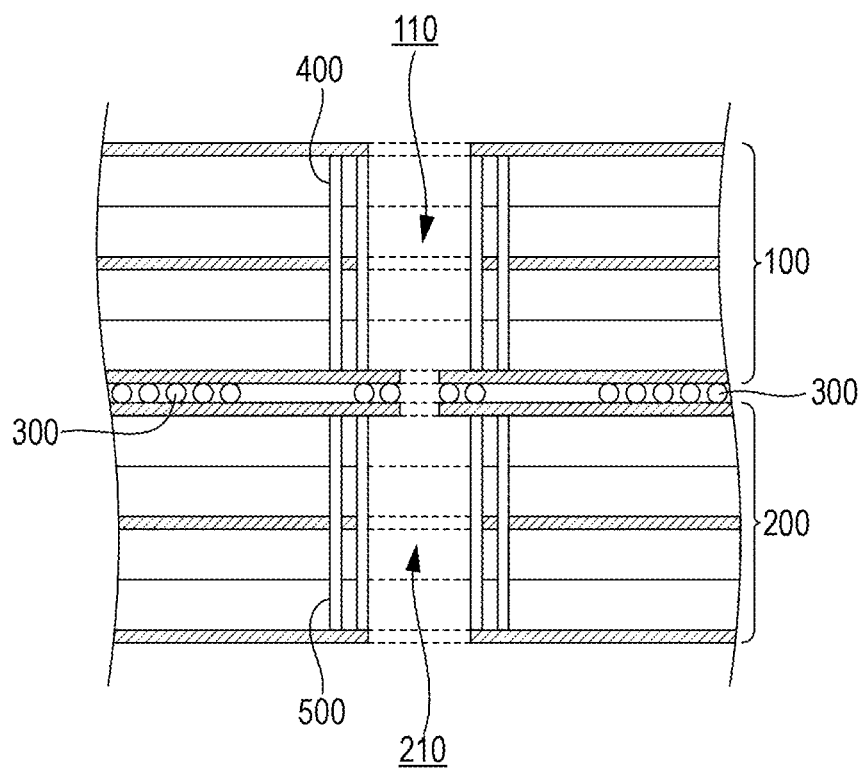
FIG. 7 is a cross-sectional view illustrating a board connection structure described in Japanese Unexamined Patent Application Publication No. 2009-303076.

FIGS. 6A and 6B are cross-sectional views each illustrating a portion including waveguides in a board connection structure according to a third embodiment. FIG. 6A illustrates a state before the air is exhausted, and FIG. 6B illustrates a state after the air is exhausted. The board connection structure according to this embodiment further includes vacuum seals 12 and an exhaust port (through hole) 13 in addition to the components of the board connection structure according to the first embodiment or the second embodiment.

The vacuum seals 12 are positioned to surround the opening 4 of the waveguide 3 and the opening 7 of the waveguide 6. The exhaust port 13 extends through the antenna board 1A'. The space defined by the vacuum seal 12, which is also located between the antenna board 1A' and the IC board 1B, is connected with the outside through the exhaust port 13.

A check valve (not illustrated) is disposed for the exhaust port 13, and the exhaust port 13 is connected to an external air exhaust device (not illustrated). The external air exhaust device is configured to exhaust air around the opening 4 of the antenna board 1A' and the air around the opening 7 of the IC board 1B. The check valve is sealed after the air is exhausted. With this configuration, as illustrated in FIG. 6B, the closeness between the antenna board 1A' and the IC board 1B is increased by the atmospheric pressure.

As described above, in the board connection structure according to this embodiment, a clearance (gap) that may result from the differences in the amount of warp of the antenna board 1A' and the IC board 1B is unlikely to be generated at the connection. Thus, the closeness between the antenna board 1A' and the IC board 1B is increased by the atmospheric pressure, and the signal is transmitted with low loss.

Herein, the first to third embodiments are described with reference to the drawings. However, the present disclosure is not limited to the above-described embodiments. Various modifications or corrections may be applied to the above-described embodiments, and such modifications and corrections are included in this disclosure.

Brief Description of Aspects of the Present Disclosure

A board connection structure according to a first aspect of the present disclosure includes a first board including a first waveguide therein and a first opening in a surface thereof, the first opening being formed at a perimeter of the first waveguide and allowing a high-frequency signal to pass therethrough, a second board including a second waveguide therein and a second opening in a surface thereof, the second opening being formed at a perimeter of the second waveguide and allowing a high-frequency signal to pass therethrough, and an insulation film provided between the first board and the second board, the insulation film having a thickness of 60% or less of a waveguide width that determines a propagation mode in at least one of the first waveguide and the second waveguide. The first opening and the second opening are connected to each other.

In the board connection structure according to a second aspect, the first waveguide has a waveguide width larger than the waveguide width of the second waveguide, and the first board has a relative permittivity that is smaller than a relative permittivity of the second board.

The board connection structure according to a third aspect of the present disclosure, further includes a vacuum seal provided in an area between the first board and the second board, and a through hole provided in one of the first board and the second board. The area includes the first opening and the second opening. The through hole connects with the area.

In the board connection structure according to a fourth aspect of the present disclosure, the insulation film is deformable under pressure.

In the board connection structure according to a fifth aspect of the present disclosure, the insulation film is formed of any one of silicon oxide, silicon nitride, silicon oxynitride, fluorocarbon polymer, benzocyclobutene, polybenzobisoxazole, and a combination thereof.

Hereinabove, the various embodiments are described with reference to the drawings. However, it should be noted that the present disclosure is not limited thereto. It is apparent that a person skilled in the art can develop various modifications or corrections within the scope of the claims. Those modifications and corrections should be included in the technical scope disclosed in the present application. In addition, the components disclosed in the above embodiments may be used in any combination without departing from the scope of the present disclosure.

The board connection structure described in the present disclosure is advantageously used for wireless communication devices or high-frequency applied devices used in household electrical appliances.

What is claimed is:

1. A board connection structure comprising:
   a first board including a first waveguide therein and a first opening in a surface thereof, the first opening being provided at a perimeter of the first waveguide and allowing a high-frequency signal to pass therethrough;
   a second board including a second waveguide therein and a second opening in a surface thereof, the second opening being provided at a perimeter of the second waveguide and allowing the high-frequency signal to pass therethrough; and
   an insulation film provided between the first board and the second board, the insulation film having a thickness of 60% or less of at least one of a waveguide width of the first waveguide and a waveguide width of the second waveguide that determines a propagation mode in at least one of the first waveguide and the second waveguide, wherein
   the first opening and the second opening are connected to each other.

2. The board connection structure according to claim 1, wherein the waveguide width of the first waveguide is larger than the waveguide width of the second waveguide, and
   the first board has a permittivity that is smaller than a permittivity of the second board.

3. The board connection structure according to claim 1, further comprising:
   a vacuum seal provided in an area between the first board and the second board, the area including the first opening and the second opening; and
   a through hole provided in one of the first board and the second board, the through hole connecting with the area.

4. The board connection structure according to claim 1, wherein the insulation film is deformable under pressure.

5. The board connection structure according to claim 1, wherein the insulation film is comprised of any one of silicon oxide, silicon nitride, silicon oxynitride, fluorocarbon polymer, benzocyclobutene, polybenzobisoxazole, and a combination thereof.

* * * * *